(12) United States Patent
Klein et al.

(10) Patent No.: US 8,067,070 B2
(45) Date of Patent: Nov. 29, 2011

(54) PICVD COATING FOR PLASTIC CONTAINERS

(75) Inventors: Juergen Klein, Herzogenrath (DE); Tanja Woywod, Mainz (DE); Stephan Behle, Gau-Odernheim (DE); Uwe Rothhaar, Birkenheide (DE)

(73) Assignee: Schott AG, Mainz (DE)

( * ) Notice: Subject to any disclaimer, the term of this patent is extended or adjusted under 35 U.S.C. 154(b) by 938 days.

(21) Appl. No.: 11/870,941

(22) Filed: Oct. 11, 2007

(65) Prior Publication Data
US 2008/0090039 A1 Apr. 17, 2008

(30) Foreign Application Priority Data

Oct. 14, 2006 (DE) .......................... 10 2006 048 658

(51) Int. Cl.
| | |
|---|---|
| *B32B 15/04* | (2006.01) |
| *B32B 15/08* | (2006.01) |
| *B32B 15/085* | (2006.01) |
| *B32B 15/09* | (2006.01) |
| *B32B 1/08* | (2006.01) |
| *B32B 27/06* | (2006.01) |

(52) U.S. Cl. ..................... 428/34.6; 428/34.7; 428/35.8; 428/35.9; 428/36.6; 428/457; 428/480; 428/500; 428/515; 428/516; 428/523

(58) Field of Classification Search .................. 428/34.1, 428/34.4, 34.6, 34.7, 35.8, 35.9, 36.4, 36.6, 428/36.7, 36.9, 36.91, 457, 469, 500, 515, 428/516, 523, 480, 688, 689, 702
See application file for complete search history.

(56) References Cited

U.S. PATENT DOCUMENTS

| | | | |
|---|---|---|---|
| 5,041,303 | A | 8/1991 | Wertheimer et al. |
| 2003/0165696 | A1 | 9/2003 | Namiki et al. |
| 2006/0029757 | A1 | 2/2006 | Komada |

FOREIGN PATENT DOCUMENTS

| | | |
|---|---|---|
| DE | 19650286 A1 | 9/1997 |
| DE | 198 01 320 A1 | 7/1999 |
| DE | 10314779 A1 | 10/2004 |
| EP | 1388594 A2 | 2/2004 |
| EP | 1630250 A1 | 3/2006 |
| JP | 2002161247 A | 6/2002 |
| WO | 96/33098 A2 | 10/1996 |
| WO | 0216484 A2 | 2/2002 |
| WO | 03/038143 A1 | 5/2003 |

OTHER PUBLICATIONS

U. Puttins, "EP Patent Application No. 07 019 903.9 Office Action and Search Report", Sep. 30, 2008, Published in: EP.

*Primary Examiner* — Walter B Aughenbaugh
(74) *Attorney, Agent, or Firm* — DeMont & Breyer, LLC (57) ABSTRACT

The invention relates to a composite material (1), to containers made therefrom and to a method for producing the composite material (1), which comprises a substrate (2) and a coating (3) on the substrate (2), wherein the coating (3) provides at least a first region (31) facing the substrate (2) and at least a second region (32) facing away the substrate (2), and wherein the first region (31) comprises a barrier layer (4) and the second region (32) a passivation layer (5).

17 Claims, 10 Drawing Sheets

PICVD COATING FOR PLASTIC CONTAINERS

FIELD OF THE INVENTION

The invention relates to plastic containers and, more particularly, to composite material for coating containers, and to a method for applying a coating onto the plastic container.

BACKGROUND OF THE INVENTION

Hollow plastic container, such as plastic bottles, do not show gas barrier properties which are sufficient for the intended use in bottles. Gases such as carbon dioxide may diffuse into or out of the container. Mostly, this effect is unwanted such, inter alia, it causes a shortening of the shelf life of beverages stored in those containers.

In order to eliminate these disadvantages of plastic containers with their otherwise manifold advantages, techniques for depositing barrier layers and diffusion blocking layers respectively have been developed. In order to arrange for reducing the permeation of gases and liquids as well as to protect the plastic material against chemical corrosion or UV radiation, is it advantageous to provide substrate materials such as three-dimensional hollow bodies, with a barrier layer. By adding coatings to low-cost mass synthetics, the same barrier properties can be achieved in container walls as with expensive special synthetics, and also glass can be replaced for example in the field of pharmaceutical packagings by using this method.

The chemical vapor deposition (CVD) is a particular effective and cost-saving technology for depositing such coatings or layers. In the CVD method, a reactive chemical gas composition, which surrounds the surface to be coated is used to deposit a layer onto the surface. Inter alia, oxide layers such as $SiO_x$ layers, have proven their value as diffusion barriers.

A chemical reactive gas composition for the CVD coating can be formed by means of energyzing thermally or by ionisation of the process gases. Since synthetics normally are thermally not sufficiently stable or have a low softening temperature, the CVD coating, under high temperatures, is not suitable for coating of plastic surfaces. But here, the option of plasma enhanced CVD coating (PECVD) lends itself. Since a heating of the surface to be coated takes place here too, particularly the plasma impulse CVD coating (PICVD) is appropriate to deposit coatings on temperature-sensitive materials such as synthetics.

But current $SiO_x$ barrier layers deposited on synthetics by means of PECVD normally have a low resistance to leaches. As shown by measurements, the barrier layer is etched off almost laminarly already starting from pH-values greater than or equal to 5 in conjunction with certain ion concentrations or electric conductances of a liquid. At this, still mineral water with low $CO_2$ content and tap water prove to be more critical concerning the stability of the layer than water pressed through osmotic filters or VE-water.

The process of etching off takes place the faster the higher the pH-value and/or the filling and storing temperature of the filled product is. Therefore, such layers have the disadvantage of having a highly reduced barrier effect, which depends on the pH-value and the storing and filling conditions, respectively, of the coating after storing a corresponding liquid in a plastic container with such a barrier layer between the plastic and the liquid. It may even happen that there is not any barrier effect at all.

The pH-value of some beverages, such as green tea, coffee produces and milk produces, as well as particularly still or only lightly carbonized mineral water, is in the range between 6.5 and 7.5. Here, a pH resistant barrier coating with a durability from 6 to 12 months at room temperature (23° C.) is requested for achieving a long shelf-life in plastic packagings.

In some countries, certain products such as green tea or coffee, are filled hotly, i.e. at temperatures of up to 95° C., subsequently stored at room temperature for up to six months, and then stored at 60° C. for up to 14 days to be sold. It also develops to heat these products by microwaves shortly before consumption. This is applied in drink dispensers for example. Also with these conditions, there is the requirement of providing a pH-resistant barrier coating.

For pharmaceutical packagings, a pH resistance of up to 10 for corresponding barrier layers is requested in case of a period of storage of typically three to five years at room temperature. Accelerated tests simulate this with a period of storage of six months at 60° C. The requirements concerning technical packagings for the packaging of, for example fine chemicals, brake fluid, cleaning agents etc. approximate the requirements concerning pharmaceutical packagings.

GENERAL DESCRIPTION OF THE INVENTION

Therefore, it is an object of the invention to develop barrier layers further so as to keep, when in contact with substances with a pH-value greater than 5, particularly greater than 6.5, their barrier properties at room temperature for at least six months.

It is a further object of the invention to produce layers with barrier properties, the barrier properties thereof, even when in contact with substances having a pH-value of 10, keeps its barrier properties at room temperature for at least three years. Furthermore, it is an object of the invention to be able to store products with a pH-value in the range between 6.5 and 7.5 at room temperature for up to 14 days in a plastic container having a barrier layer, without essentially affecting the barrier layer.

The invention provides a new and useful composite material showing excellent barrier properties. Furthermore, the invention provides a method for producing such a composite material.

The composite material of invention comprises a substrate and a coating on the substrate. Thereby, the coating provides at least a first region facing the substrate and at least a second region facing away from the substrate. The first region comprises a barrier layer and the second region comprises a passivation layer.

According to the invention, the passivation layer is a so-called "top-coat", i.e. the last layer of the coating, when viewed from the substrate side. By the passivation layer, a protection layer against corrosion, particularly by etching, is provided for the barrier layer. Therefore, in case of an operative barrier, the composite material according to the invention has a considerably increased life time compared to materials with coatings not having a passivation layer. Compared to the barrier layer, bonds types are affected by depositing the passivation layer such that the disintegration of the barrier layer is at least delayed, in the most cases even avoided essentially.

Special parameters, which may be determined already in the case of an unused composite material and correlate with the increased life time appearing during usage, were found by the inventors in terms of an O-parameter and a N-parameter. In a preferred embodiment of the invention, the passivation layer provides an O-parameter measured with ATR (attenuated total reflection) with $$O\text{-Parameter} = \frac{\text{Intensity at } 1253\,\text{cm}^{-1}}{\text{Intensity at}(1000\,\text{cm}^{-1} \text{ to } 1100\,\text{cm}^{-1})}$$

in the range from 0.4 to 0.9, preferably in the range from 0.45 to 0.55. The intensity value in the range between 1000 cm$^{-1}$ and 1100 cm$^{-1}$ is determined as follows:

Intensity at (1000 cm$^{-1}$ to 1100 cm$^{-1}$)=max[Intensity (1000 cm$^{-1}$); Intensity(1100 cm$^{-1}$)].

This means that the highest value is used for the intensity, wherein this value appears in the range from 1000 cm$^{-1}$ to 1100 cm$^{-1}$. It depends on the particular specific structure of the probe, at which wave number the peak, one is interested in, is.

With ATR measurements, the intensity is determined as "absorbance" in arbitrary units.

Preferably, the passivation layer comprises a N-parameter measured with ATR (attenuated total reflection) with $$N\text{-Parameter} = \frac{\text{Intensity at } 840\,\text{cm}^{-1}}{\text{Intensity at } 799\,\text{cm}^{-1}}$$

in the range from 0.7 to 1.6, preferably in the range from 0.83 to 1.01.

When producing the passivation layer, a CVD-method, preferably a PICVD method, is used according to the invention, wherein silicon or organometallic compounds are used as a precursor. Preferably, HMDSO (Hexamethyldisiloxane) is used as a precursor to form a nonpolar organic top coating as passivation layer on a barrier coating. It proved that the passivation layer according to the invention shows its preferable effect just when there are certain intensity ratios of the signals measured by SIMS (secondary ions mass spectrometry) for characteristic species.

According to the invention, the passivation layer of the composite material provides an intensity ratio $I_{c3/Si}$ of the signals measured by SIMS for the intensity I of $C_3$ and Si in the range from 2.5 to 7. Preferably, the intensity ratio $I_{SiO2/Si}$ of the signals measured by SIMS (secondary ions mass spectrometry) for the intensity I of $SiO_2$ and Si is in the range from 40 to 3.

According to the invention, the intensity ratio $I_{SiH/Si}$ of the signals measured by SIMS (secondary ions mass spectrometry) for the intensity I of SiH and Si is 15 to 10.

Within the scope of the invention, passivation layers proved being especially stable, which comprise $Si_xO_zC_y$. Thereby, x is in the range from 15 to 30. The value for y is in the range from 10 to 65, preferably in the range from 25 to 60. The value y being in the range from 35 to 55 is particularly preferred. The value for z is in the range from 10 to 55, preferably in the range from 15 to 50. The value z being in the range from 20 to 40 is particularly preferred. The sum of x, y and z yields 100. The passivation layer comprises no fluorine or comprises essentially no fluorine.

The values for x, y and z are referenced in at-% and were determined by means of MCs+-analyses. This analysis method is a technique for quantitative SIMS-surveys, wherein MCs+ secondary ions are detected, which are generated after shooting the material to be tested with primary caesium ions. There, M stands for the element to be detected. The MCs+-ions are formed by combination of sputtered neutral M-ions and implanted and resputtered Cs+-ions.

Particularly by means of a PICVD method, the invention enables the deposition of passivation layers also on temperature-sensitive substrates and barrier coatings. Thus preferably, a composite material is provided by the invention including a substrate which comprises at least a synthetic or plastic material, particularly at least one polyester and/or at least one polyolefin and/or at least one temperature-sensitive compostable synthetic material. For example, the substrate may comprise PE and/or PP and/or PET and/or PEN and/or LDPE and/or HDPE and/or PC and/or COC/COP and/or PLA. Within the scope of the invention, the substrate, however, may comprise paper and/or at least one composite substance. Generally, materials with $T_G$ (=softening temperature) below 250° C. may be used as substrates.

Preferably, the passivation layer is used as per the composite material according to the invention, in order to protect a barrier coating in a container, such as a bottle or a plastic can for example, as especially provided in vending machines, against corrosion, which is exerted on the container material in the case of conventional containers by the contact with a fluid filled in the container. The barrier coating comprises $SiO_x$. The stoichiometry of the barrier coating amounts x>2 and preferably a C-content of less than 10 at –%.

The thickness of the barrier coating is in the range from 5 nm to 1 µm, preferably in the range from 10 nm to 500 nm. A thickness being in the range from 15 nm to 200 nm is particularly preferred. The thickness of the passivation layer is in the range from 5 nm to 2 µm, preferably in the range from 10 nm to 1 µm. A thickness being in the range from 20 nm to 500 nm is particularly preferred.

Therefore, the invention provides a container, which comprises a hollow body, wherein the hollow body defines an internal space and has at least one opening which connects the internal space with the surrounding area of the hollow body. For example, the opening can be the bottleneck of a bottle for beverages or the open-top side of a can. The hollow body comprises at least a composite material as described above. Preferably, the passivation layer faces the internal space of the hollow body.

For producing a composite material according to the invention, the invention furthermore provides a method with the following steps:
 a) providing of at least one substrate which comprises a barrier layer in a conditioning chamber (or treatment room),
 b) evacuating the conditioning chamber,
 c) forming of a passivation layer by plasma impulse CVD-coating (PICVD coating).

Within the scope of the invention, the substrate may be provided in the form of a container for example having a barrier coating inside. Coating such containers by means of PICVD is described in the applicant's publication DE 102 53 512 A1. The content of this document for carrying out a PICVD method for the internal coating of containers is incorporated by reference into the present application.

Preferably, HMDSO is essentially used as a precursor, when forming a passivation layer, in order to effectuate an essentially nonpolar organic top layer on the barrier layer.

Additionally or alternatively, a passivation layer may also be formed by compressing the structure of the barrier layer in its region facing away from the substrate. For forming the passivation layer, the conditioning chamber is grounded and a HF-bias (radio frequency bias) is applied between a gas lance (pipe with an exit opening for directing gas) and the grounded conditioning chamber. By doing so, the particles being deposited during the procedure of the PICVD method are moved away from the gas lance and therewith onto the substrate, which is located between the gas lance and the wall of the conditioning chamber, such that, when impinging the barrier layer existing on the substrate, this layer is compressed because of the "impacts" of the particles being deposited.

In a preferred embodiment of the invention, when forming the passivation layer, heavy ions, especially noble gas ions such as Ar and/or Xe for example, are admixed to the precursor gas, in order to compress the passivation layer. When forming the passivation layer, frequencies in the range of MW (middle wave radio frequencies), particularly 2.45 GHz, or HF (high frequency radio frequencies) are used to excite the plasma, because it has proven that then the compression of the corresponding region of the barrier layer is particularly effective.

In the following, the invention is described referring to the enclosed drawings in more detail by means of embodiments. The same components are provided with the same reference signs.

DETAILED DESCRIPTION OF THE INVENTION

Figure 1:
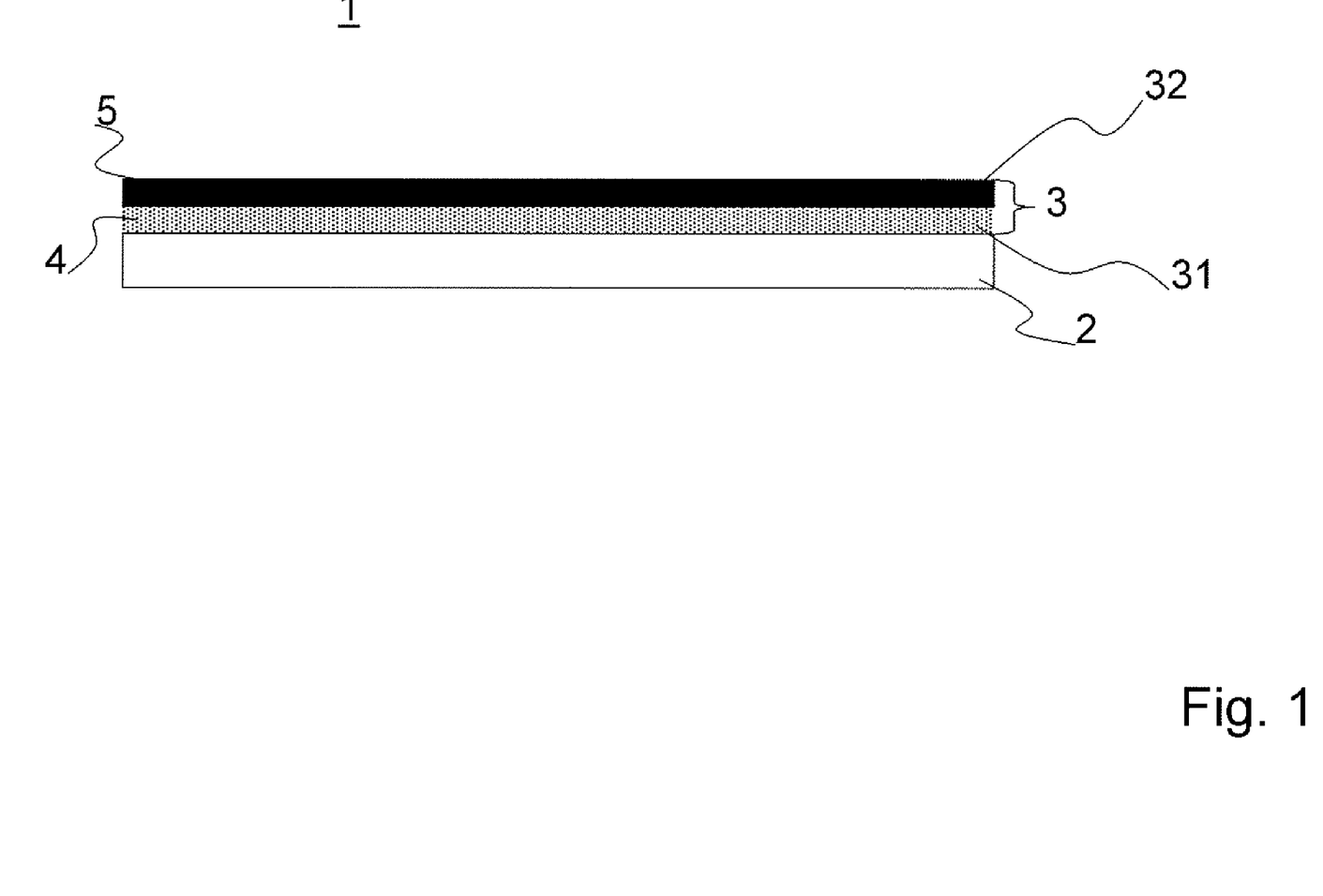
FIG. 1 is a schematic representation of a longitudinal section through a composite material according to a first embodiment of the invention.

As shown in FIG. 1, the composite material 1 comprises a substrate 2 and a coating 3. The coating 3 has a first region 31 which faces the substrate 2, and a second region 32 which faces away from the substrate 2. The coating 3 comprises a barrier layer 4 and a passivation layer 5 as a top coat. The barrier layer suppresses the exchange in matter between the surroundings of the substrate 2 which, in the representation of FIG. 1, corresponds to the region below the substrate 2, and a medium being in contact with the composite material 1, such as the substances to be kept within the container made up of the composite material of the invention. In FIG. 1, this medium is above and in contact with the passivation layer 5. The passivation layer 5 protects the barrier layer 4 against corrosion by this medium.

Figure 2:
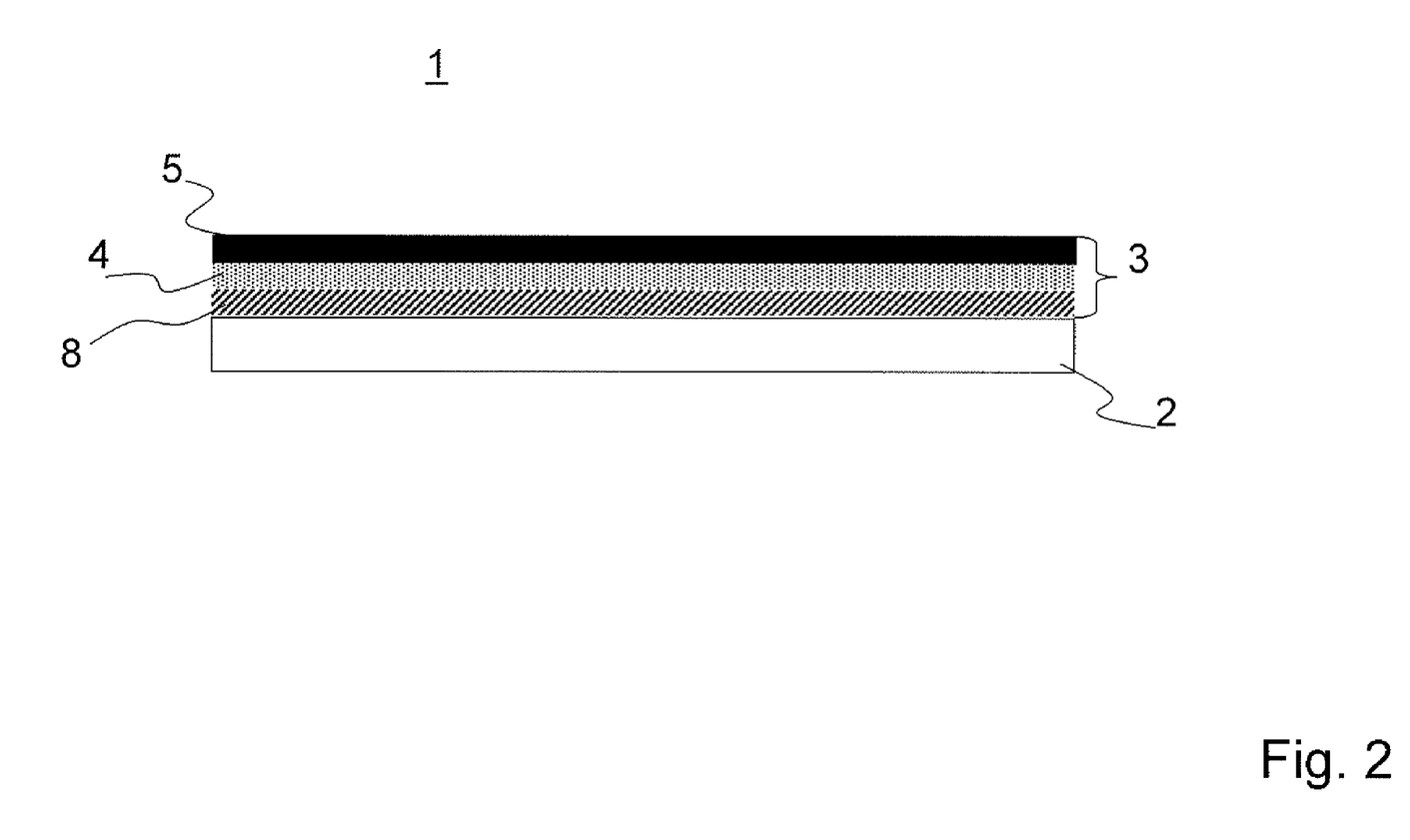
FIG. 2 is a schematic representation of a longitudinal section through a composite material according to a second embodiment of the invention.

According to a further embodiment of the invention, the coating 3 may comprise a bonding layer or adhesion promoting layer 8 in addition to the barrier layer 4 and the passivation layer 5, in order to improve the adhesion of the coating on the substrate 2. Such a bonding layer is shown in FIG. 2. Such composite materials are particularly suited for internal coating of containers.

Figure 3:
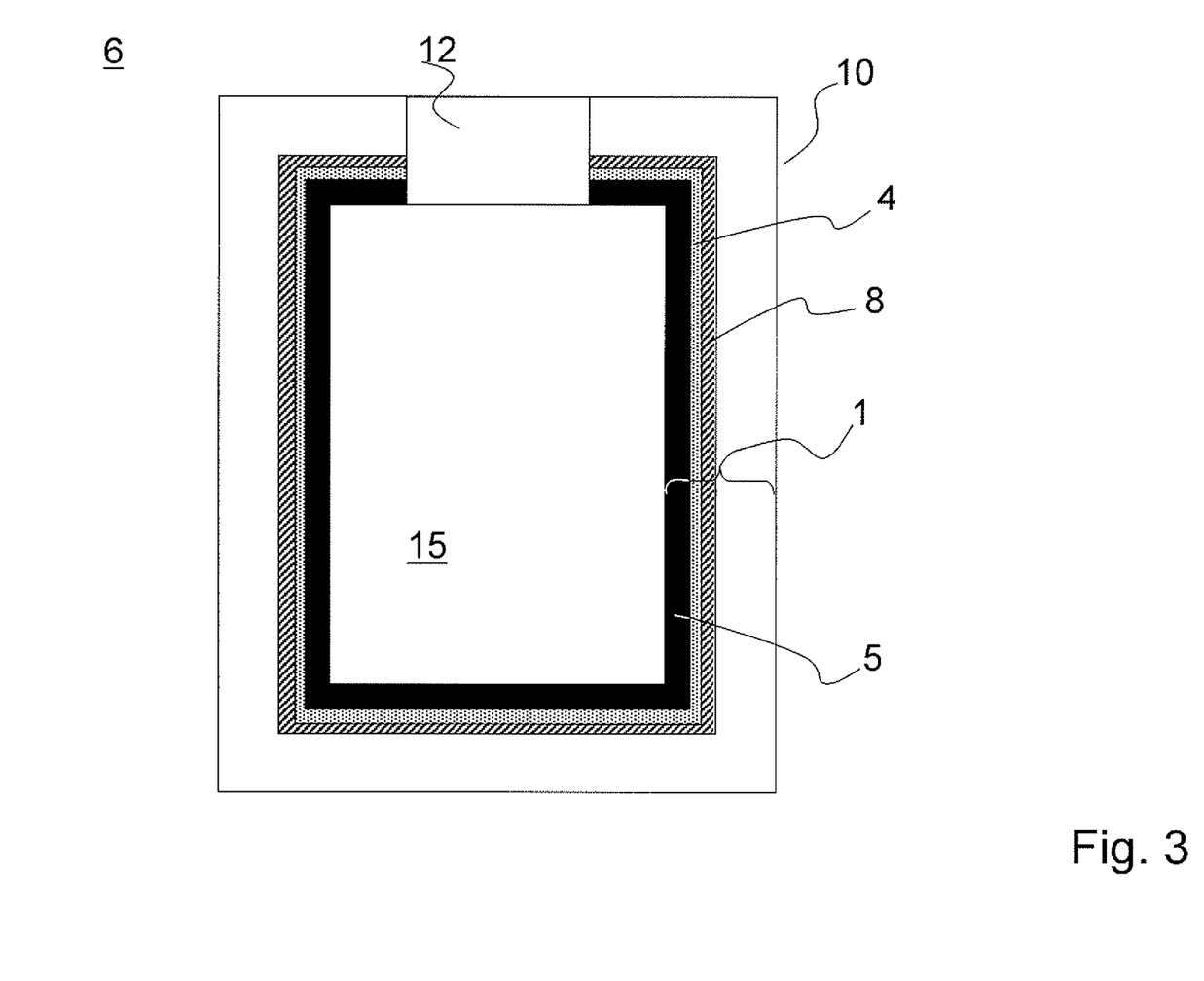
FIG. 3 is schematic representation of a longitudinal section through a container with a composite material according to the second embodiment of the invention.

Such a container 6 is shown in FIG. 3. The container 6 comprises a hollow body 10 enclosing an internal space 15 and having an opening 12. A medium, a beverage for instance, may be filled in the internal space 15 and removed therefrom. The internal space 15 is separated from the barrier layer 4 by the passivation layer 5. For improving the adhesion of the layer system, the bonding or adhesion layer 8 is placed between the barrier layer 4 and the substrate.

For the embodiments shown in the FIGS. 1 to 3, the corresponding coatings were analyzed by means of SIMS. Additionally, ATR measurements were performed. When forming the layers, the precursor HMDSO was used for the passivation layer and the precursor HMDSN (Hexamethyldisilazane) for the barrier layer. For the passivation layer, the precursor concentration in the gas composition was varied from 17% to 45% and to 73% up to 100%. For HMDSN, a variation was carried out from 1.2% to 45% up to 100%.

Figure 4:
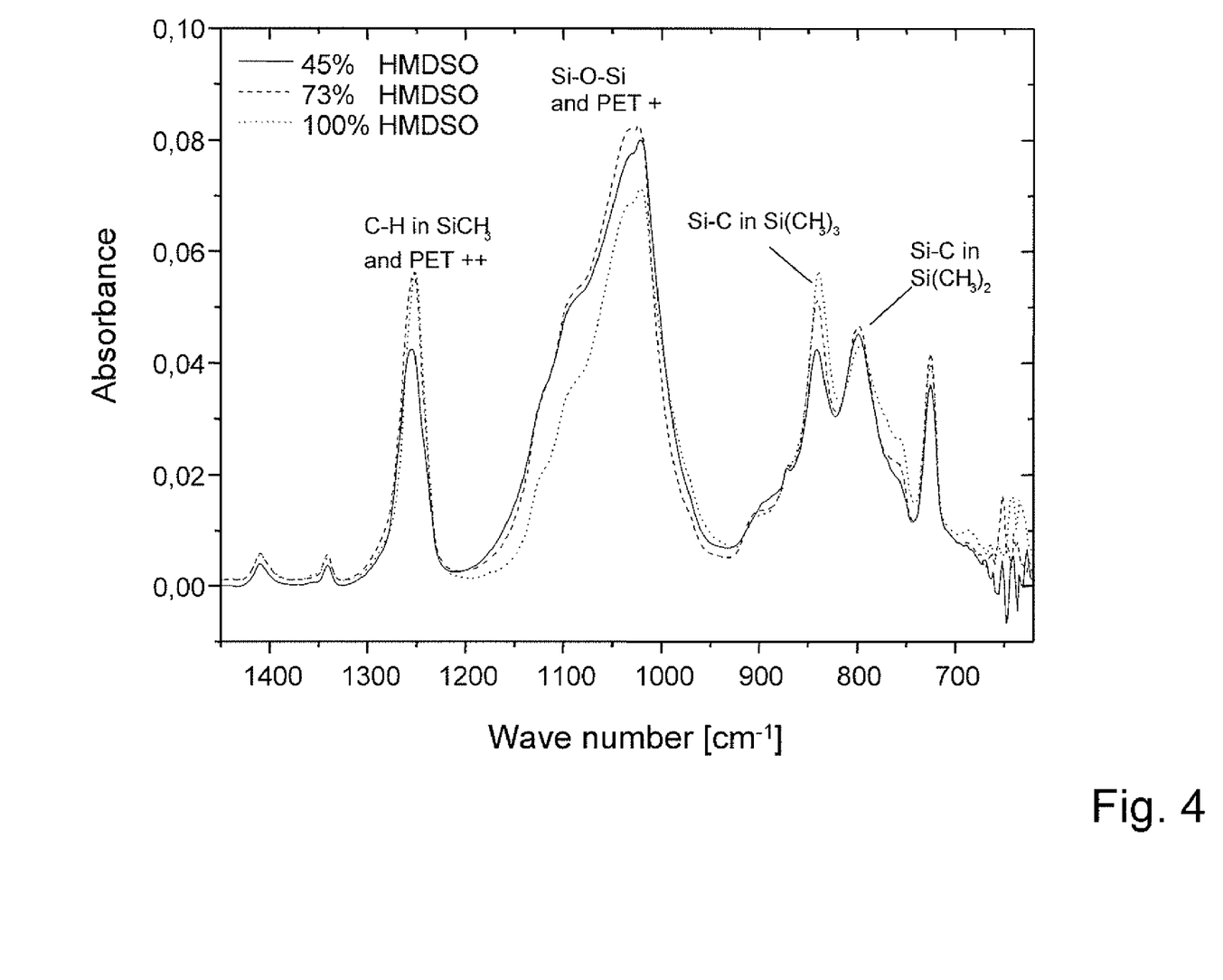
FIG. 4 is a diagram, which shows the result of an ATR-analysis (ATR=attenuated total reflection) of four passivation layers according to the invention, the passivation layers being formed at different precursor concentrations.
Figure 5:
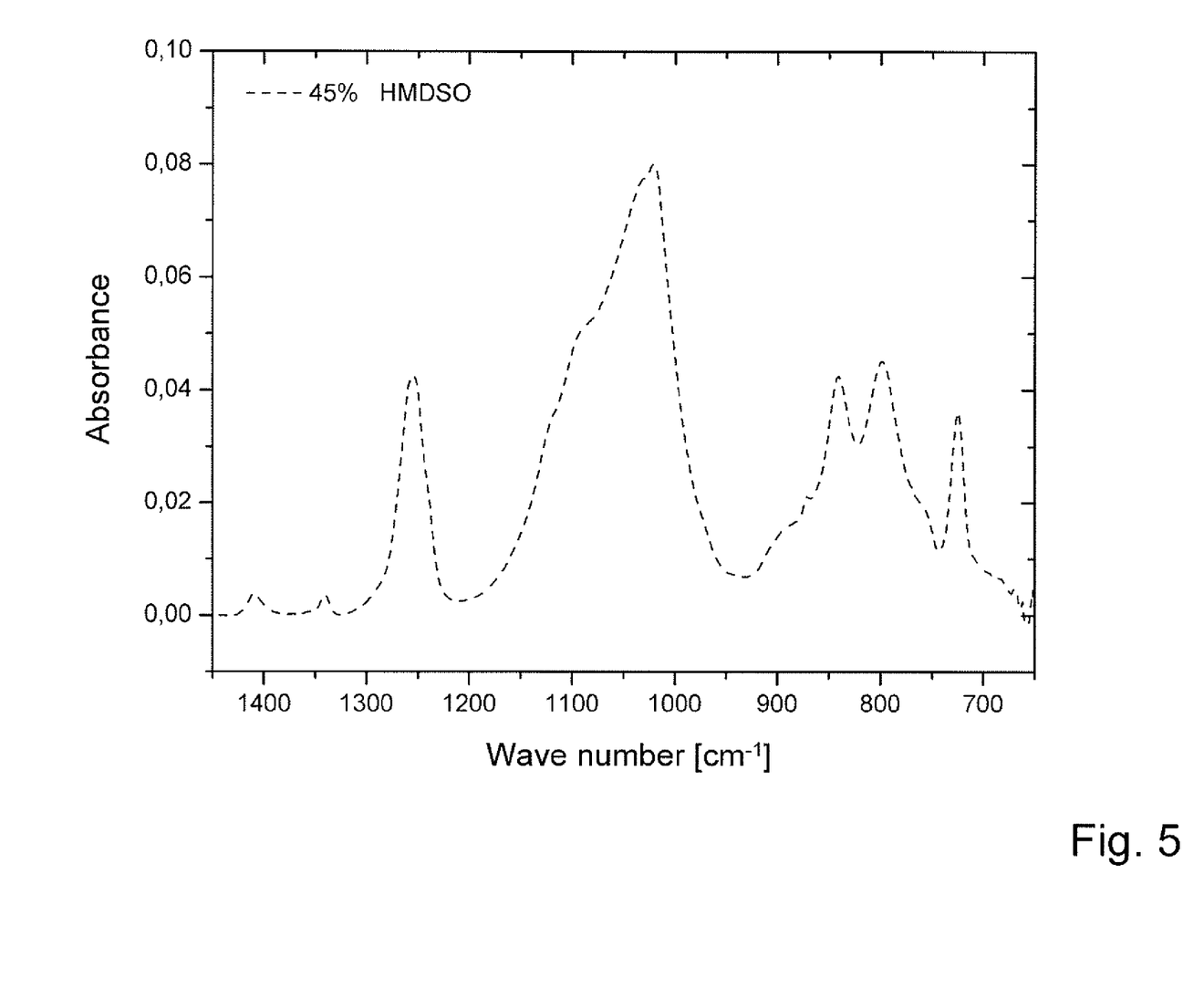
FIG. 5 is a diagram with the result of an ATR-measurement for the passivation layer being formed at a precursor concentration of 45% HMDSO.

The ATR spectrum for passivation layers with variable precursor concentration during the production thereof is shown in FIG. 4. Certain bond types may be detected at characteristic wave numbers. In FIG. 5, the ATR-spectrum for one kind of passivation layer, which was formed with 45% HMDSO as precursor in the gas composition for the coating, is shown. From the ATR-measurements, characteristic numbers concerning the organic portion and the interlacing inside the layers were determined as O- and N-parameters starting from intensity values at wave numbers of 840 cm$^{-1}$, 799 cm$^{-1}$, 1253 cm$^{-1}$, 1000 cm$^{-1}$ and 1100 cm$^{-1}$. The results are compiled in table 1.

During the experiments, the precursor concentration was varied and increased from low values up to 100%. It depends on the PICVD-facility used in each case, which values of the precursor concentration provide optimal results for the N- and the O-parameter, respectively. Therefore, appropriate optimizations have to be carried out when changing the facility. In the circumstance at hand, the HMDSO concentration was increased from 17% to 45% and to 73% up to 100%, and the HMDSN concentration from 1.2% to 45% up to 100%.

TABLE 1

N- and O-parameter for layers based on HMDSO and HMDSN

|  | N-Parameter | O-Parameter |
|---|---|---|
| HMDSO | | |
| 100% ↓ | 0.88 ± 10% | Superimposed by PET |
|  | 0.92 ± 10% | 0.5 ± 10% |
|  | 1.19 ± 10% | 0.7 ± 10% |
|  | 1.44 ± 10% | 0.8 ± 10% |
| HNDSN | | |
| 100% ↓ | Non interpretable (PET) | Non interpretable |
|  | 0.9 ± 20% | 0.9 ± 20% |
|  | 1.5 ± 20% | 3.3 ± 20% |

Figure 6:
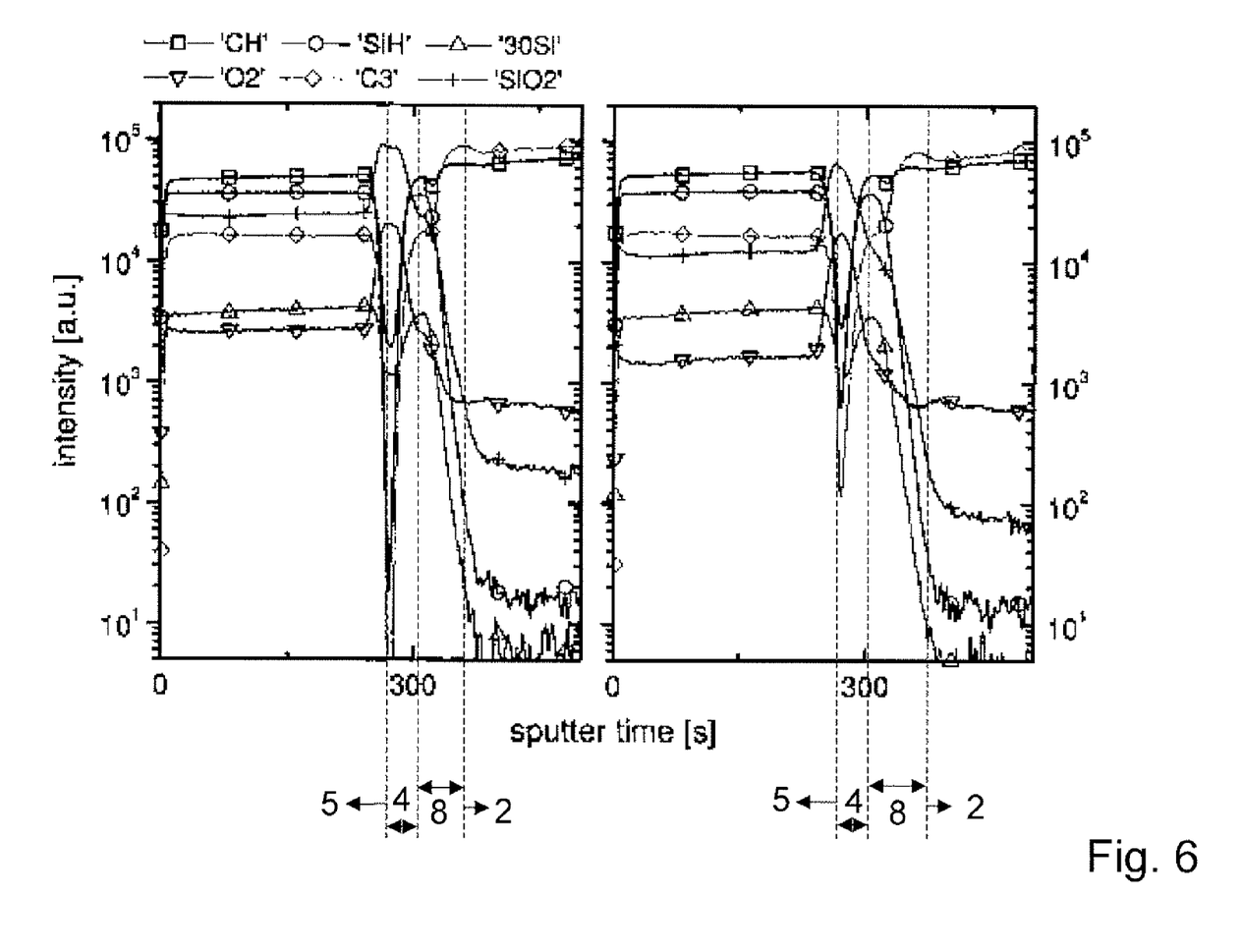
FIG. 6 shows two SIMS intensity sputter time profiles (SIMS=secondary ion mass spectrometry) of a composite material according to the invention.

In FIG. 6, SIMS intensity sputter time profiles of a composite material according to the invention are plotted. The diagram shown on the left side of FIG. 6 was measured with a composite material having a passivation layer 5 which was formed at a precursor concentration of 45% HMDSO, and which provides a barrier layer 4 which was deposited at a precursor concentration of 1.2% HMDSN, as well as, on a PET-substrate 2, provides a bonding layer 8 which was formed at a precursor concentration of 17% HMDSO. When forming the passivation layer, the precursor concentration was 73% HMDSO for the composite material, whose SIMS sputter time profile is shown in the right diagram of FIG. 6. The remaining parameters are unchanged.

Interpreting such SIMS-analyses resulted in the intensity ratios compiled in table 2. Concerning the variation of the precursor concentration, what has been said in the context of table 1 applies, too.

TABLE 2

SIMS intensity ratios for layers based on HMDSO and HMDSN

| HMDSO | $C_3$/Si | $SiO_2$/Si | SiH/Si | |
|---|---|---|---|---|
| | 2.8 | 43 | 14 | |
| ↓ | 4.1 | 9.2 | 12 | |
| | 5.2 | 5.3 | 11 | |
| 100% | 6.7 | 3.7 | 11 | |

| HMDSN | $C_3$/Si | $SiO_2$/Si | SiH/Si | SiN/Si |
|---|---|---|---|---|
| | 0.01 | 35.4 | 1.4 | 0.04 |
| ↓ | 3.2 | 7.2 | 11 | 6.6 |
| 100% | 5.2 | 0.12 | 7.4 | 7.1 |

The ratio of the intensity of the signal measured by means of SIMS for $C_3$ and the intensity of the signal measured by means of SIMS for Si is indicated by specifications of the form "$C_3$/Si". The HMDSO and the HMDSN concentrations, respectively, give the concentration in the coating gas in vol.-%, wherein the remainder is oxygen, which concentrations were used when forming the analyzed layer.

With increasing HMDSO and HMDSN concentrations, the organic character of the layer increases, as proved by the SIMS-$C_3$/Si-ratio and the O-parameter from the ATR-analysis. Based on MCs+ deep profile analyses, a characterisation of the composition of the $Si_xO_zC_y$-layers took place, which were deposited on PET in the PICVD method using different precursor concentrations.

For analyzing, relative sensitivity factors from analyses of matrix-like probes were available. WDX-analyses (WDX=Wavelength dispersive X-ray diffraction) were carried out at an excitement energy of 5 keV (signal out from the layer only), in order to determine the composition of the layers quantitatively. Neglecting the hydrogen content, which could not be measured for methodical reasons, the C-Astimax-standard (100% C) and Herasil (=100% SiO2) were used for the analysis. The related results are graphically shown in FIG. 7 (upper representation).

Figure 7:
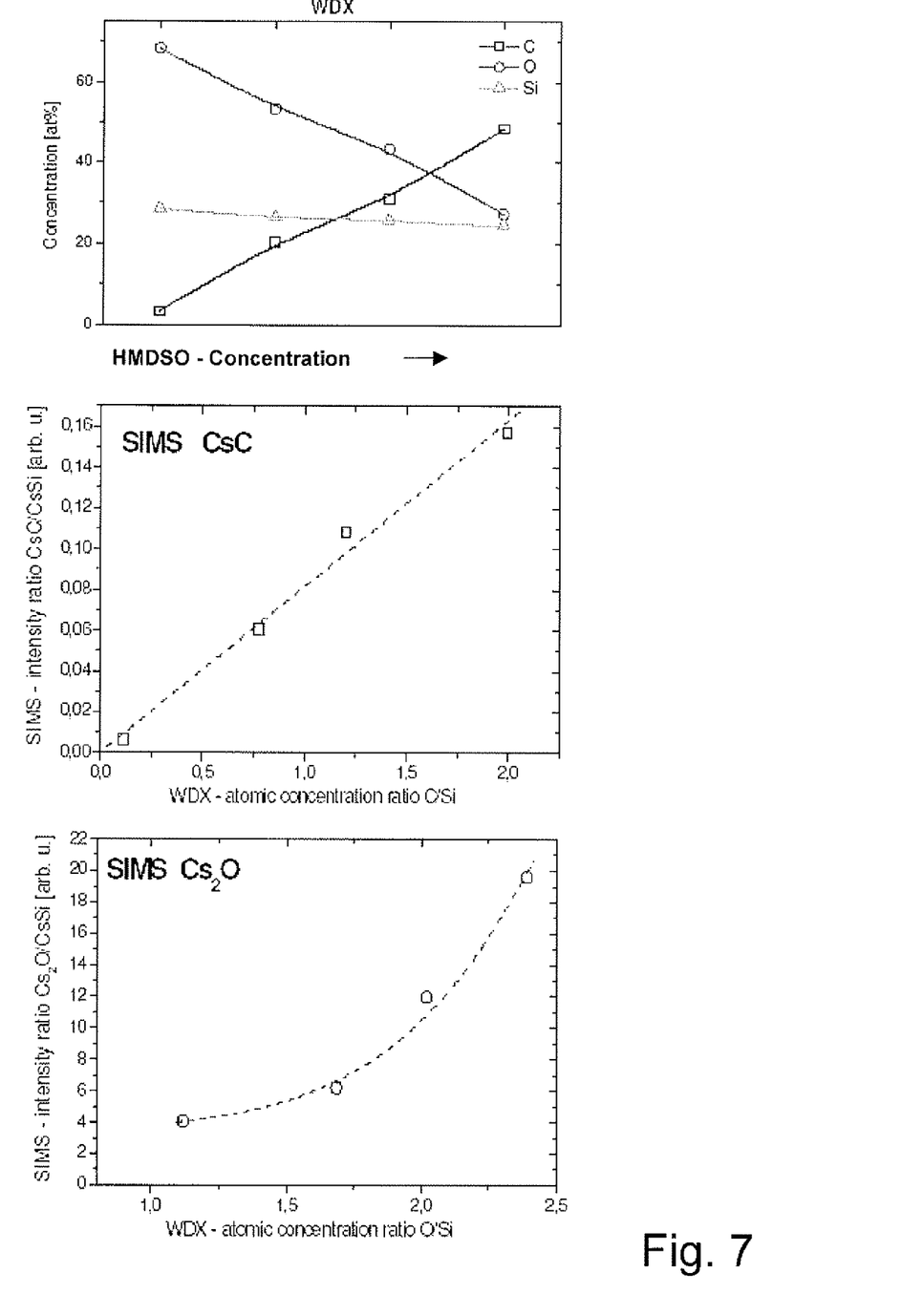
FIG. 7 is a schematic representation to illustrate the determination of sensitivity factors for interpreting the analyses, composition of the layers (above) and relative SIMS sensitivity factors (below)

Due to the method used, quantitative WDX or EDX analyses (EDX=energy dispersive X-ray spectroscopy) are limited to layers with a minimum thickness of some 100 nm. The semi-quantitative MCs+-alternative of SIMS lends itself for thinner layers. In FIG. 7, the intensity ratios CsC+/CsSi+ and $Cs_2O$+/CsSi+ from corresponding depth profilings are plotted versus the concentration ratios (from WDX-analysis).

A linear dependency results for CsC+/CsSi+, i.e. for the $SiO_xC_y$-layers, a relative sensitivity factor may be determined which allows quantifying the C/Si-portion. But when determining the O/Si-portion, the non-linear dependency of the MCs+-intensities on the composition has to be taken into account (see FIG. 7).

TABLE 3

| HMDSO-Concentration | Int. | Int. | Concentration [at. -% ± 5 at. -%] | | |
|---|---|---|---|---|---|
| [Vol. -%] | CsC/CSi | $Cs_2O$/CsSi | C (y) | Si (x) | O (z) |
| | 0.18 | 7.9 | 44 | 20 | 36 |
| ↓ | 0.19 | 5.3 | 48 | 21 | 31 |
| | 0.21 | 5.0 | 52 | 20 | 28 |
| 100 | 0.23 | 4.6 | 55 | 20 | 25 |

In table 3, the abbreviation "Int" stands for intensity, "Int. CsC/CSi" stands for the intensity ratio of the signal for CsC and the signal for CSi, accordingly, "Int. $Cs_2O$/CsSi" stands for the intensity ration of the signal for $Cs_2O$ and the signal for CsSi. The HMDSO concentration gives the concentration in the coating gas, which concentration was used, when forming the analyzed passivation layer, wherein the remainder is oxygen. For varying the precursor concentration, the same applies which was said in the context of table 1.

Figure 8:
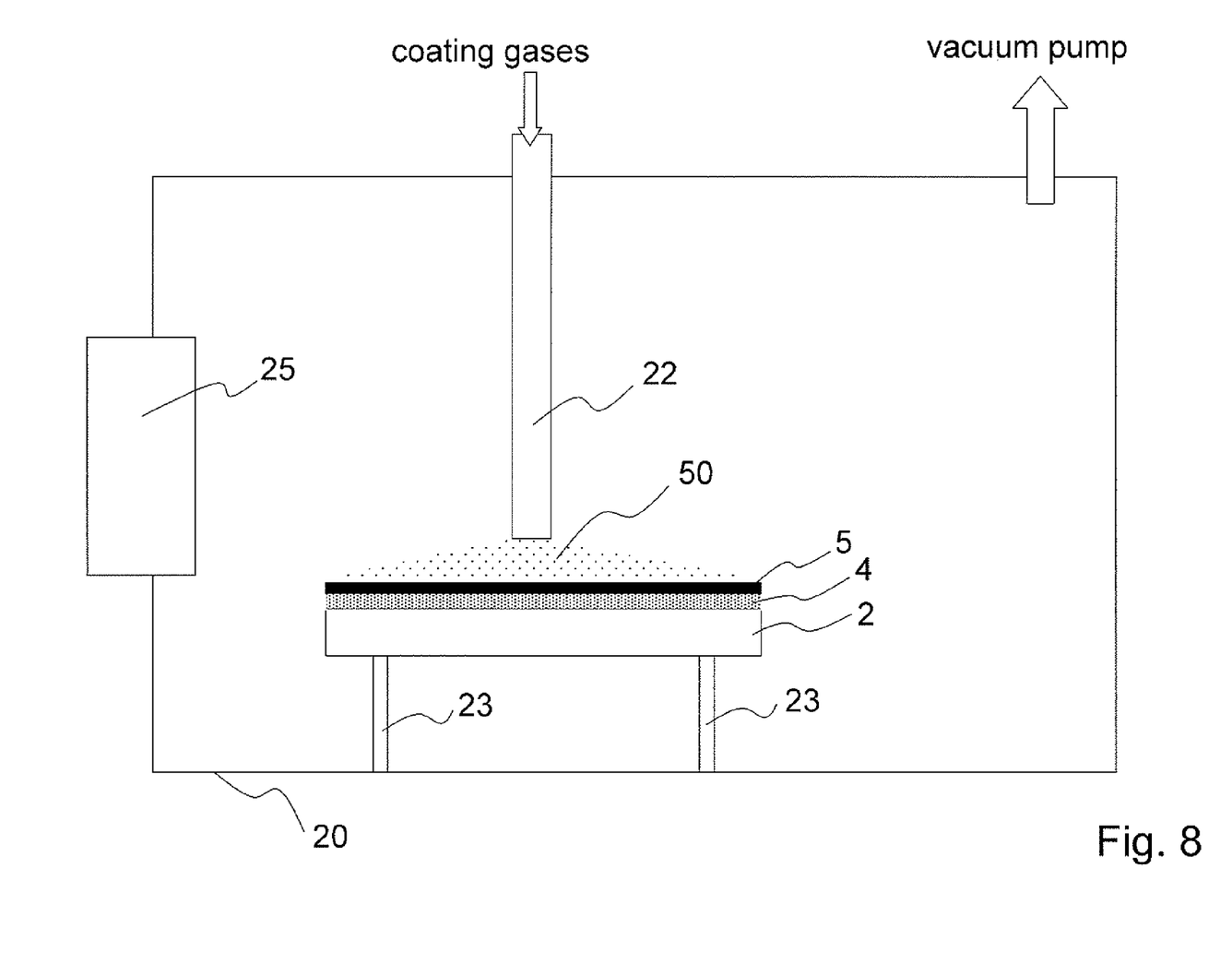
FIG. 8 is a schematic representation to illustrate the implementation of the method according to the invention in a first embodiment.

The formation of a composite material with a passivation layer described above in more detail is shown in the FIGS. 8 to 10. The substrate 2, which has a barrier layer 4, is provided in a conditioning chamber 20. This is indicated in the figures by holding the substrate 2 on substrate holders 23. By means of a vacuum pump (not shown), the conditioning chamber is evacuated. The coating gases are directed into the conditioning chamber by means of a gas lance 22. There, a plasma is ignited by means of a plasma source 25. When doing so, according to the invention, particles 50 are deposited on the surface of the barrier layer 4, forming a passivation layer 5 (see FIG. 8).

Figure 9:
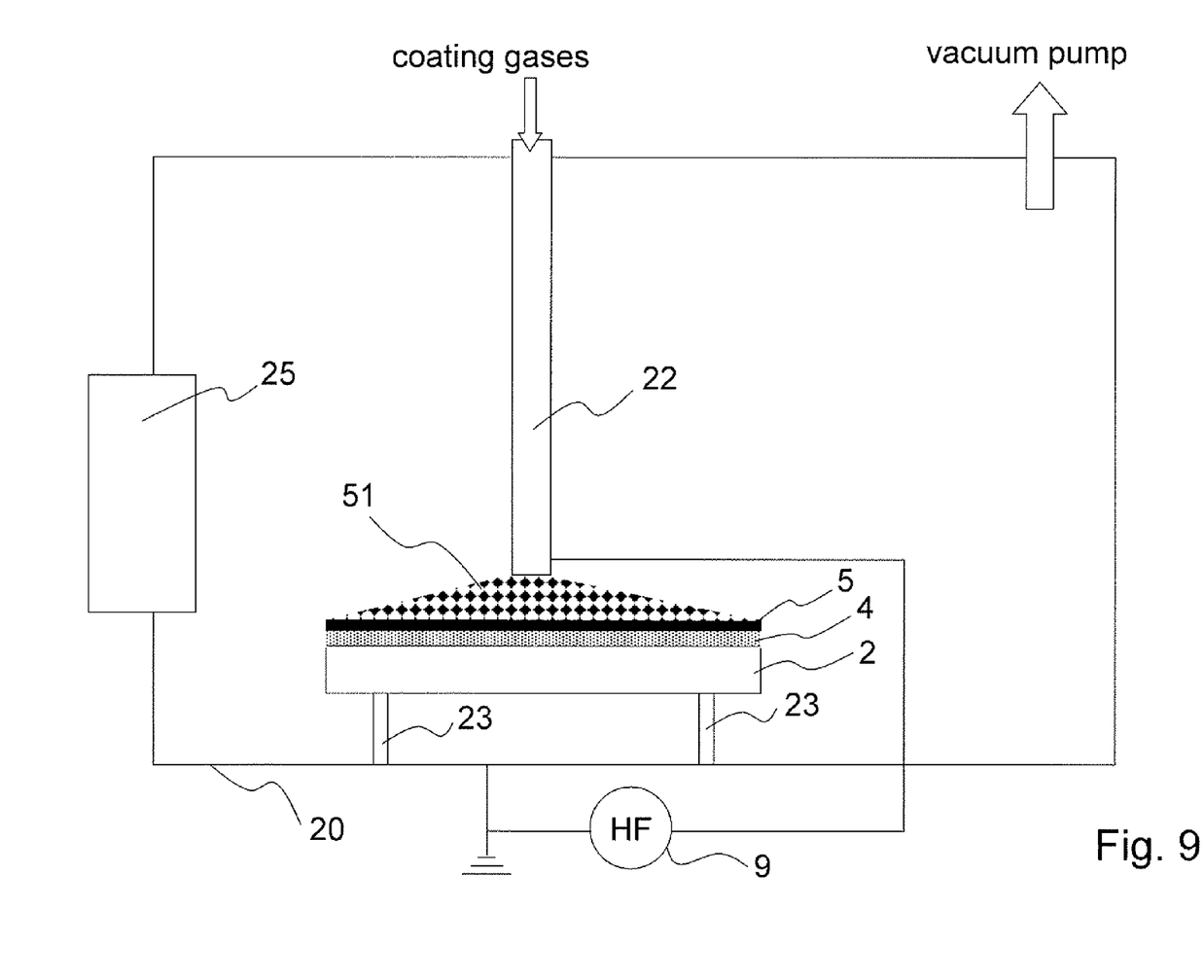
FIG. 9 is a schematic representation to illustrate the implementation of the method according to the invention in a second embodiment.

In a further embodiment of the method, shown in FIG. 9, a radio frequency or HF-bias 9 is applied between the grounded conditioning chamber 20 and the gas lance 22. Heavy ions, such noble gas ions, are admixed to the coating gases 51.

The ions are accelerated in the edge layer of the electric field between the plasma and the container 20 and impinge with high energy onto the surface of the emerging composite material and the coating, respectively. In case of sufficient ion energy, this leads to a compression of the coating and a reduction of structural disorders like "pinholes". When doing so, the energy of the HF-bias is chosen such that it does not get down to an overheating and/or even to sputtering from of the coating.

The improved adhesion of the coating on plastic substrates is a particular advantage of this method. Furthermore, frequencies, which generate, in comparison to a microwave excitement, a higher plasma edge layer voltage may be used as exciting frequencies for producing the plasma in the conditioning chamber.

Figure 10:
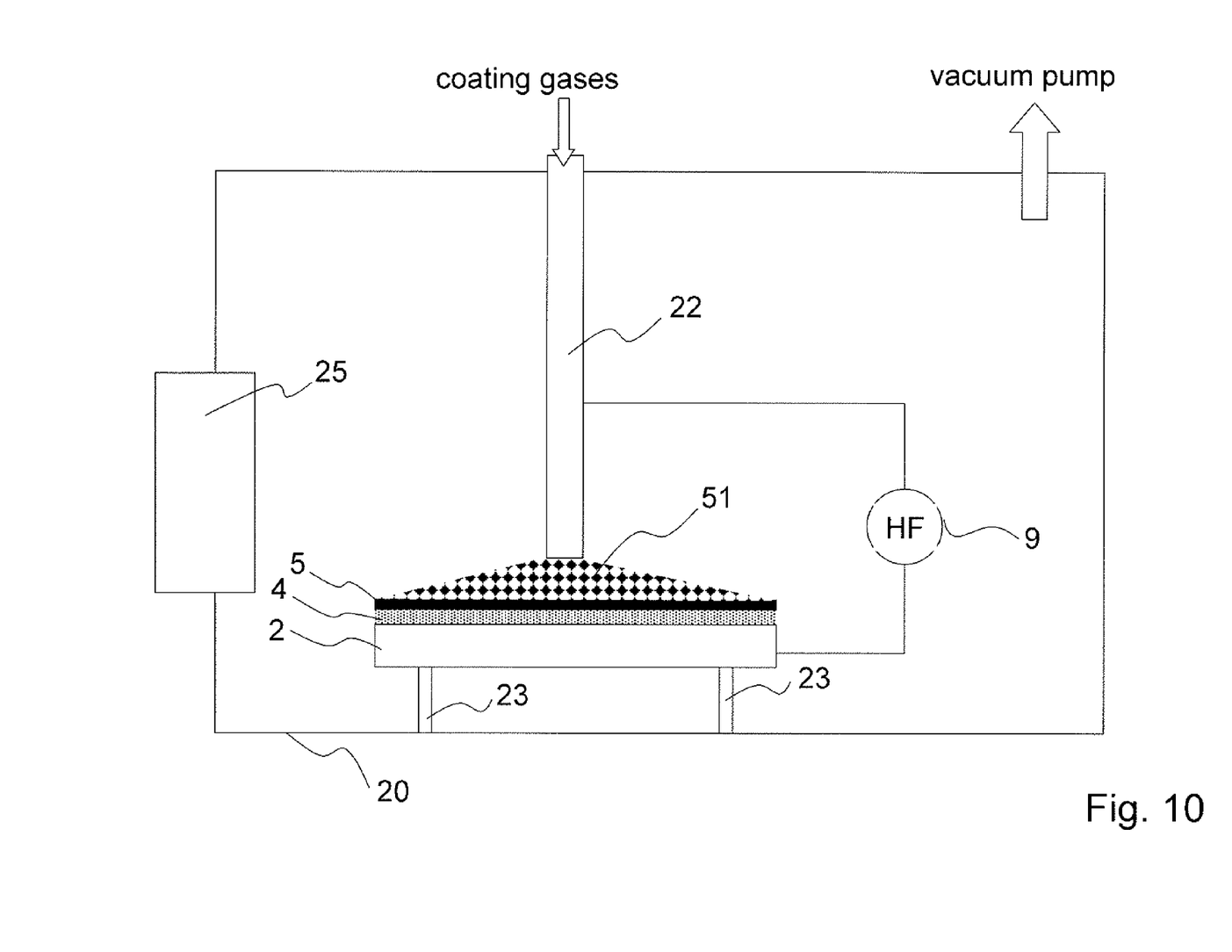
FIG. 10 is a schematic representation to illustrate the implementation of the method according to the invention in a third embodiment.

According to a further embodiment of the method, shown in FIG. 10, the HF-bias may also be applied between the substrate and the gas lance. Thereby, the substrate holders 23 are isolated with respect to the substrate. Then, the electrical field is concentrated in the region in which the coating of the passivation layer takes place so that the deposition of the particles forming the layer and the admixed heavy ions is especially effective.

It is obvious for the person skilled in the art that the invention is not limited to the embodiments precedingly described, but can be varied in various ways. Particularly, the features of the individual embodiments can also be combined with each other. Obviously, modifications and alterations of this specification will occur to others upon reading and understanding of this specification. It is intended to include all such modi-

| List of reference signs | |
|---|---|
| 1 | composite material |
| 2 | substrate |
| 3 | coating |
| 31 | first region of the coating |
| 32 | second region of the coating |
| 4 | barrier layer |
| 5 | passivation layer |
| 50 | particles, which are deposited as a PICVD coating |
| 51 | particles, which are deposited as a PICVD coating and comprise heavy ions |
| 6 | container |
| 8 | adhesion promoting layer |
| 9 | HF-bias, voltage source |
| 10 | hollow body |
| 15 | internal space of the hollow body |
| 20 | conditioning chamber or treatment room |
| 22 | gas lance |
| 23 | substrate holder in the conditioning chamber |
| 25 | plasma source |

The invention claimed is:

1. A composite material comprising:
a substrate and
a coating on the substrate,
wherein the coating comprises at least a first region facing the substrate, at least a second region facing away the substrate,
wherein the first region comprises a barrier layer and the second region comprises a passivation layer, wherein the passivation layer shows an O-Parameter measured with attenuated total reflection (ATR) with $$O-\text{Parameter} = \frac{\text{Intensity at } 1253 \text{ cm}^{-1}}{\text{Intensity at } (1000 \text{ cm}^{-1} \text{ to } 1100 \text{ cm}^{-1})}$$

in the range from 0.4 to 0.9, wherein an intensity value in the range between 1000 cm$^{-1}$ and 1100 cm$^{-1}$ is determined as the maximum intensity at (1000 cm$^{-1}$ to 1100 cm$^{-1}$).

2. The composite material of claim 1, wherein the passivation layer includes Si$_x$O$_z$C$_y$, the sum of x, y and z being 100.

3. The composite material of claim 2, wherein the value of x is in the range from 15 to 30, and the value of y is in the range from 10 to 65, and the value of z is in the range from 10 to 55.

4. The composite material of claim 3, wherein the value of y is in the range from 25 to 60.

5. The composite material of claim 4, wherein the value of y is in the range from 35 to 55.

6. The composite material of claim 3, wherein the value of z is in the range from 15 to 50.

7. The composite material of claim 6, wherein the value of z is in the range from 20 to 40.

8. The composite material of claim 1, wherein the O-parameter is in the range from 0.45 to 0.55.

9. The composite material of claim 1, wherein the substrate comprises a plastic material selected from the group consisting of at least a polyester material, at least a polyolefin material and at least a temperature-sensitive, compostable material.

10. The composite material of claim 1, wherein the substrate comprises at least one material selected from the group consisting of PE, PP, PET, PEN, LDPE, HDPE, PC, COC/COP and PLA.

11. The composite material of claim 1, wherein the substrate comprises at least one material selected from the group consisting of paper and at least one compound material.

12. A container having a container wall surrounding an internal space,
wherein the container wall comprises a composite material defined by a substrate and a coating on the substrate,
wherein the coating comprises at least a first region facing the substrate, at least a second region facing away the substrate,
wherein the first region comprises a barrier layer and the second region comprises a passivation layer, and
wherein the passivation layer shows an O-Parameter measured with attenuated total reflection (ATR) with $$O\text{-Parameter} = \frac{\text{Intensity at } 1253 \text{ cm}^{-1}}{\text{Intensity at } (1000 \text{ cm}^{-1} \text{ to } 1100 \text{ cm}^{-1})}$$

in the range from 0.4 to 0.9, wherein an intensity value in the range between 1000 cm$^{-1}$ and 1100 cm$^{-1}$ is determined as the maximum intensity at (1000 cm$^{-1}$ to 1100 cm$^{-1}$).

13. The container of claim 12, wherein the passivation layer faces the internal space.

14. A composite material comprising:
a substrate, and
a coating on the substrate,
wherein the coating comprises at least a first region facing the substrate and at least a second region facing away the substrate,
wherein the first region comprises a barrier layer and the second region comprises a passivation layer, wherein the passivation layer shows an N-Parameter measured with attenuated total reflection (ATR) with $$N\text{-Parameter} = \frac{\text{Intensity at } 840 \text{ cm}^{-1}}{\text{Intensity at } 799 \text{ cm}^{-1}}$$

in the range from 0.7 to 1.6.

15. The composite material of claim 14, wherein the N-Parameter is in the range from 0.83 to 1.01.

16. A container having a container wall surrounding an internal space,
wherein the container wall comprises a composite material defined by a substrate and a coating on the substrate,
wherein the coating comprises at least a first region facing the substrate and at least a second region facing away the substrate,
wherein the first region comprises a barrier layer and the second region comprises a passivation layer, and
wherein the passivation layer shows a N-Parameter measured with attenuated total reflection (ATR) with $$N\text{-Parameter} = \frac{\text{Intensity at } 840 \text{ cm}^{-1}}{\text{Intensity at } 799 \text{ cm}^{-1}}$$

in the range from 0.7 to 1.6.

17. The container of claim 16, wherein the N-parameter is in the range from 0.83 to 1.01.

* * * * *